United States Patent [19]

Johnson et al.

[11] Patent Number: 5,086,292

[45] Date of Patent: Feb. 4, 1992

[54] TAMPER DETECTION DEVICE FOR UTILITY METER

[75] Inventors: Dennis F. Johnson; Michael Wiebe, both of Winnipeg Manitoba, Canada

[73] Assignee: Iris Systems Inc., Winnipeg Manitoba, Canada

[21] Appl. No.: 429,458

[22] Filed: Oct. 31, 1989

[51] Int. Cl.$^5$ .............................................. G08B 21/00
[52] U.S. Cl. ...................................... 340/637; 324/110
[58] Field of Search .................... 324/110; 379/107; 340/637

[56] References Cited

U.S. PATENT DOCUMENTS

| | | | |
|---|---|---|---|
| 4,321,531 | 3/1982 | Marshall | 340/637 |
| 4,331,915 | 5/1982 | Fielden | 324/110 |
| 4,357,601 | 11/1982 | McWilliams | 340/370.02 |
| 4,654,662 | 3/1987 | Van Orsdel | 340/870.03 |
| 4,670,737 | 6/1987 | Rilling | 341/13 |
| 4,707,679 | 11/1987 | Kennon et al. | 341/310 A |
| 4,866,761 | 9/1989 | Thornboroug et al. | 379/107 |

Primary Examiner—Jin F. Ng
Assistant Examiner—Jill Jackson
Attorney, Agent, or Firm—Adrian D. Battison; Stanley G. Ade; Murray E. Thrift

[57] ABSTRACT

A system for detection of tampering with a utility meter provides not only an indication that tampering has occurred but also sufficient information to enable an estimation of actual consumption to be made as opposed to the tampered metered consumption. The device includes a plurality of tampering sensors sensing tilt, electric field, magnetic field, temperature, sound, reverse rotation of a moving element and excessive difference between metered consumption and an approximate actual consumption. The device also measures the movement of the moving element. These sensed signals are recorded in sequential time periods of for example eight hours so that an analysis can be made on a daily basis to provide an accurate pattern of consumption as opposed to the tampered meter consumption pattern.

14 Claims, 3 Drawing Sheets

TAMPER DETECTION DEVICE FOR UTILITY METER

BACKGROUND OF THE INVENTION

This invention relates to a system and apparatus for detection and monitoring of a utility meter tampering, commonly associated with service theft.

Within the last decade, the incidents of utility service theft has increased substantially as noted in a recent report by Dr. K. Seger a leading U.S. industry expert in theft management for utilities.

This report stated that as utility rates have increased so has the number of utility customers who are stealing power. As the incidents of power theft increases so does the need for utilities to attack this problem aggressively and in a professional manner. An unmanaged power theft problem can have a disastrous effect on the economic well being of the utility. In some countries, utilities are loosing as much as 30% of all the power generated to non-technical line loss or more correctly power theft. Most of these countries are now taking a major effort to reduce these losses and recover lost revenues.

Fortunately in North America this problem has not been experienced at such alarming proportions. The current estimate in the U.S.A. is that approximately 3% of the power generated is stolen and that 1% of all utility customers are involved in power theft. An economist writing in Public Utilities Fortnightly (Nov. 22, 1979 pp. 23-27) estimated at 1.7 billion dollars in electricity and 1.3 billion dollars in natural gases lost to utility thieves in U.S.A.

Many attempts have therefore been made to detect tampering of the metering equipment by any unauthorized user. These detection systems can be as simple as extended observation of the equipment concerned. In other cases tampering detection devices have been proposed as part of a highly complex remote meter reading system.

Remote meter reading has other problems which have limited its acceptance. This has therefore left the problem of tampering detection with little solution.

One proposal for this problem is to provide an entirely separate metering device which is positioned on the wires leading to the facility at a position upstream of the conventional meter. This device does however require the presence of a utility repairman with all the attendant notice that this will give the user an additional device is being attached. Additional devices of course are readily apparent and therefore relatively available for tampering or removal.

Further details of the devices are difficult to obtain since the manufacturers wish to keep the techniques used confidential to avoid alerting potential thieves to techniques which can be used to by-pass the system. However the following companies are believed to have systems as follows:

Data Beam Inc. provides a device which indicates that it has a capability of detecting motion or tilting of the meter and tampering with the meter reading electronics.

American Science and Engineering provide a device which is stated to detect and report reverse rotation of a meter.

En Scan provides a device in a remote meter reading system which claims a capability of detecting and reporting meter motion and tampering with meter reading electronics.

Micro Port International provides a device which claims to have a magnetic reed switch for sensing removal of a glass cover of a conventional electric meter.

In many of these cases the tampering detecting device merely provides a alarm which indicates that tampering has taken place. While an indication of suspected tampering is highly desirable, it is by no means the complete answer since it gives no indication of the amount of the consumption loss and in many cases it requires a serviceman to visit the meter to effect repairs. Far from saving costs, this can exacerbate the situation by increasing maintenance costs.

SUMMARY OF THE INVENTION

It is one object of the present invention. therefore, to provide an improved device for detection of tampering with the operation of a utility meter.

According to the invention, therefore, there is provided a tamper detection apparatus for a utility meter of the type having a moving element driven by usage of the utility, the apparatus comprising a housing shaped and arranged so as to be separate from the meter and mountable inside the meter, first transducer mean for detecting movement of said moving element, second transducer means for detecting one or more events associated with possible tampering attempts, clock means for generating a plurality of sequential time periods of predetermined length, memory means for recording in each of a predetermined number of said predetermined tim periods, a summation of the amount of movement detected by the first transducer means and the detection of a tampering event by said second transducer means, a battery for providing power to said transducer means and said memory means, and means for transmitting to a reader information stored in the memory.

According to a second aspect of the invention there is provided a method of method for detection of unauthorized tampering with the operation of a utility meter and for estimation of the difference between measured utility consumption and an actual utility consumption comprising mounting a unit in a utility meter of a type having a moving element, unit being separate from the meter and removable therefrom, generating a plurality of sequential time periods of predetermined length less than one day in length, detecting during each time period a summation of the movement of the moving element and recording said summation in a memory, in each of said time periods, detecting one or more events associated with possible tampering attempts and recording the existance of such event in the memory, reading from the unit the information stored in the memory and separately analyzing the information stored in relation to the time and day of the respective time period recorded and in relation to any tampering event recorded in the time period to thus obtain a pattern during said time periods of actual consumption for extrapolation of the actual consumption during time periods when tampering has taken place.

The device therefore combines a variety of tamper detection sensors with consumption monitors and computer based analysis techniques to not only detect tampering but also to estimate the magnitude of recorded consumption era. This allows the utility company to indicate to the user an estimation of the amount of power stolen so that hopefully a settlement can be reached and the monetary loss recovered.

The device therefore provides a loss estimation system which employs recorded senso output and time information to estimate the magnitude of loss associated with tampering. The device is battery operated and can record disk rotation in both positive and negative directions and tamper events in the plurality of time periods selected. This information can be collated with temperature data relating to the time periods concerned since utility consumption and particularly electricity consumption is known to vary in dependence upon the temperature changes. The device provides the internal clocking function which permits time tagging of the tamper events so that these tamper events can be collated with variations in the consumption data.

With the foregoing in view, and other advantages as will become apparent to those skilled in the art to which this invention relates as this specification proceeds, the invention is herein described by reference to the accompanying drawings forming a part hereof, which includes a description of the best mode known to the application and of the preferred typical embodiment of the principles of the present invention, in which:

DESCRIPTION OF THE DRAWINGS

In the drawings like characters of reference indicate corresponding parts in the different figures.

DETAILED DESCRIPTION

Figure 1:
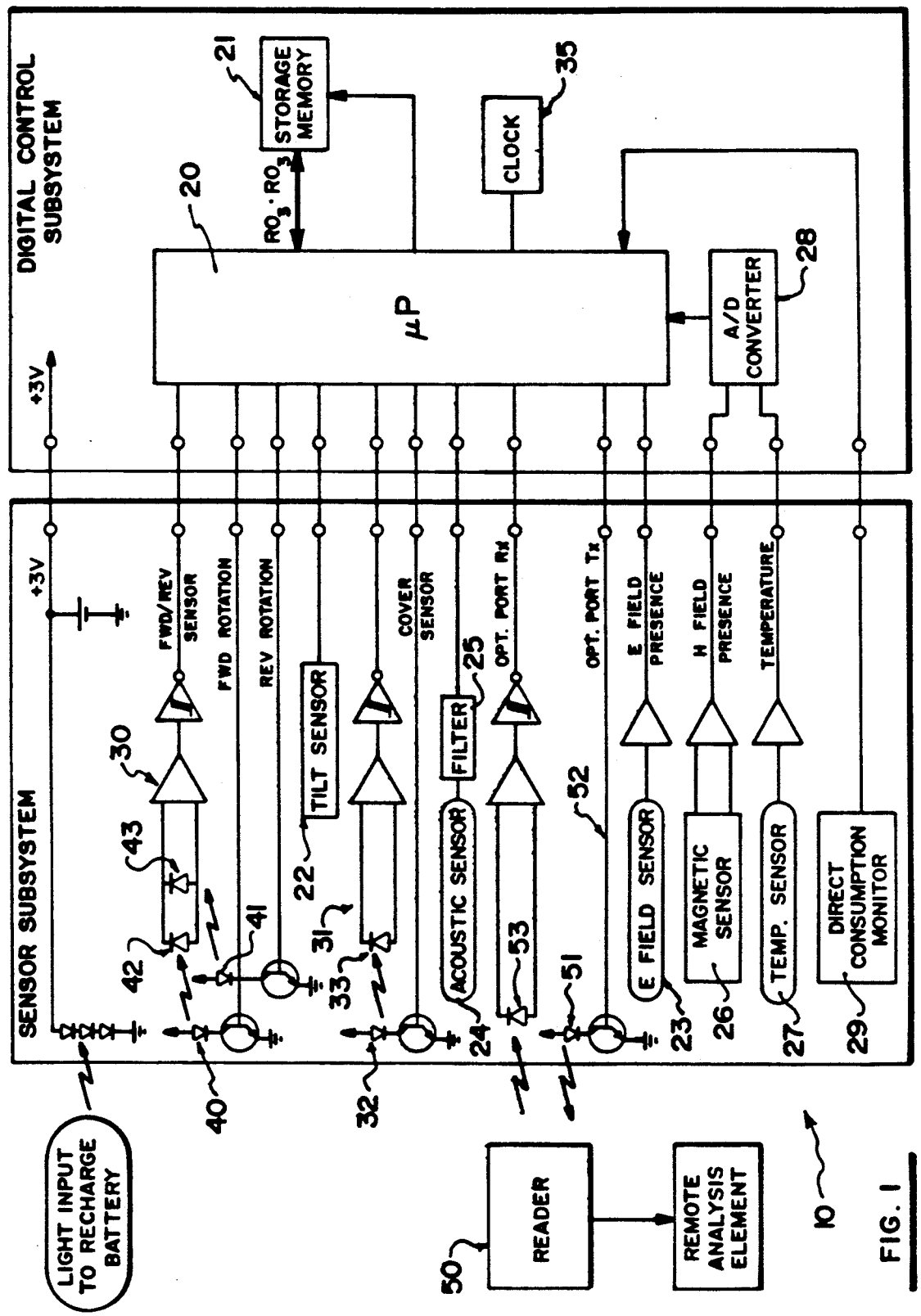
FIG. 1 is a schematic illustration of the system according to the present invention.
Figure 2:
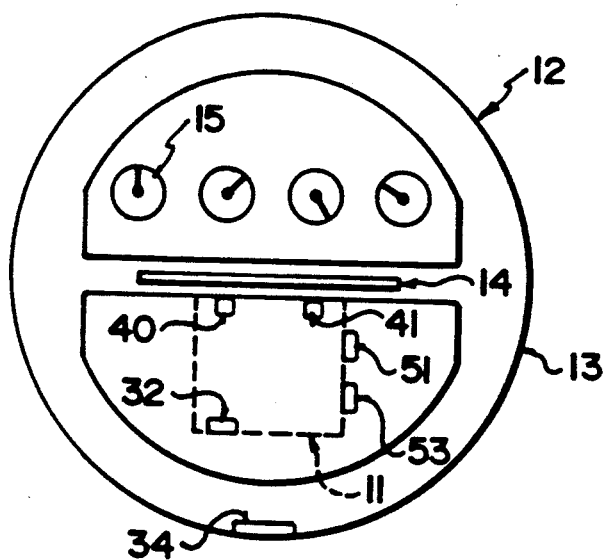
FIG. 2 is a front elevational view of a conventional electricity meter with the detection unit of the present invention installed.
Figure 3:
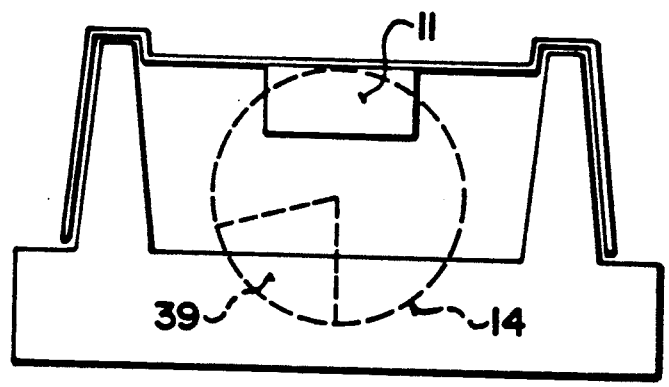
FIG. 3 is a bottom plan view of the electricity meter of FIG. 2.

The detection unit is schematically indicated at 10 in FIG. 1 and this is mounted in a suitable housing shown at 11 in FIG. 2 with the housing including suitable mounting arrangement for attachment of the housing into the interior of a conventional electricity meter 12.

The meter 12 includes an outer casing 13 which is generally transparent. Within the casing is provided the meter system which includes a disk 14 which rotates about a horizontal axis and is driven at a rate dependent upon the current drawn to the facility. The numbers of turns of the disk 14 are counted by a counting system including mechanical dials 15. As the meter is of conventional construction and various different designs are well known, no further detail will be given here.

The housing 11 is a sealed housing which prevents tampering with the sensors, microprocessor and memory systems located within the housing.

Turning now to FIG. 1, the detection device 10 comprises a microprocessor 20 which has associated therewith a storage memory 21.

A number of sensors are provided for detection of tampering events. These sensors are as follows:

(a) A tilt sensor 22 is provided to detect movement of the housing through an angle greater than a predetermined angle so that once the device is installed indication can be made if the device is removed or if the meter is removed from its normal orientation.

(b) A sensor 23 is provided which detects the presence of an electric field. Provided there is no power failure, the electric field sensor should continue to detect the presence of an electric field unless the meter is removed from the system.

(c) An acoustic sensor 24 is provided which detects sounds. The sounds detected are transmitted through a filter 25 which is arranged to filter by analog or digital techniques the sound signal so as to allow to pass through only those sounds which have been determined by previous experimentation to relate to cutting or drilling action particularly on the cover.

(d) A sensor 26 is provided which detects the presence of a magnetic field. A magnetic field is generated by the coils driving the disk 14 so that magnetic fields should always be present unless the meter has been by-passed or removed. As is well known, the rate of rotation of the disk is dependent upon the magnetic field and therefore this rate of rotation can be varied by changing the magnetic field by applying a permanent or electromagnet in the area of the meter to vary the magnetic field. The sensor 26 is therefore responsive to variations in the magnetic field greater than a predetermined amount so as to indicate that an attempt has been made to vary the magnetic field adjacent the disk to slow down the rotation of the disk.

(e) A sensor 27 is provided which detects temperature so that the temperature associated with a particular time period can be recorded.

Both the sensor 26 and 27 communicate through analog digital converter indicated at 28 for transmission of the information to the microprocessor.

The sensor 27 relating to the temperature can be omitted if required and this information replaced by information gained from a public weather information source. In some cases the meter is located inside the building and hence the temperature will remain substantially constant whereas the outside temperature is well known to vary consumption quite dramatically.

(f) A further sensor 29 comprises a direct consumption monitor which can be of a very simple construction since it is not intended to act as an accurate measure of the consumption of the electricity used. The direct consumption monitor can therefore simply be a device which detects the value of the magnetic field generated on the assumption this is proportional to the current drawn. The direct consumption value obtained can then be compared with a measurement of the consumption as recorded by the rotation of the disk 11. In the event that the direct consumption monitor provides a sum of the consumption over a time period which is different from the consumption measured by rotation of the disk 11 by an amount greater than a predetermined proportion then the direct consumption monitor can be used to provide a tamper signal. This would be indicative for example of a mechanical tag applied to the disk to reduce recorded consumption.

(g) A further sensor generally indicated at 30 (discussed in more detail hereinafter) detects reverse rotation of the disk 11 and provides an input to the microprocessor on detection of such an event.

(h) A further sensor generally indicated at 31 is used to detect the continual presence of the cover 13. The cover sensor comprises a light emitting diode 32 which generates a light beam which is then reflected to a photo diode 33. The absence of the reflected beam at the photo diode 33 is detected and transmitted as a tamper signal to the microprocessor. The reflected beam is generated by a reflective strip 34 applied on the inside surface of the cover adjacent the diode 32 as shown in FIG. 2.

The above sensors thus act to detect various tampering events so that the presence of such a tampering event can be recorded in the memory 21 under control of the microprocessor 20.

The microprocessor includes also a clock signal generator 35 so the microprocessor can create a plurality of time periods arranged sequentially and each of a predetermined length. In the example of the present invention shown the time periods are eight hours in length and the microprocessor is arranged to record in each eight hour period the presence of a tamper event from one or more of the tamper signals.

Figure 4:
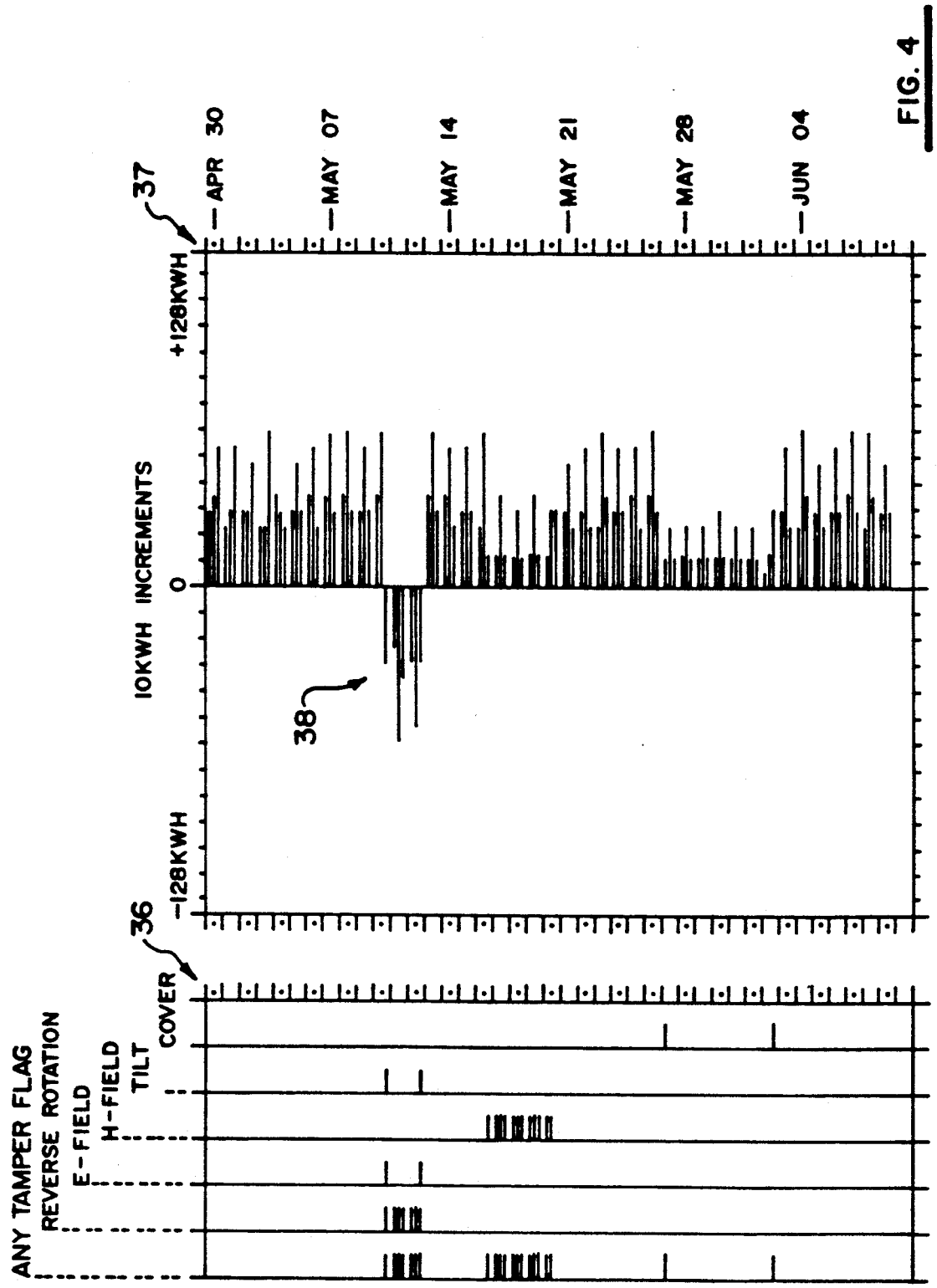
FIG. 4 is an illustration of a typical printout from the information obtained by the detection unit of FIG. 1.

As shown in FIG. 4 the series of the pre determined time periods is recorded with the series allocated against specific dates and each eight hour period within the day concerned having a separate recording location within the memory 21. One such series is shown in FIG. 4 where a number of tampering events are indicated generally shown at 36. The print-out thus indicates when any tampering event has occurred and in addition then identifies which type of tampering event has taken place.

The rotation of the disk 11 is also detected t accurately record the number of rotations of the disk both in a forward and in a reverse direction. In FIG. 4 there is indicated at 37 a table showing in graphic form the amount of rotation of a disk recorded in eight hour periods as previously described. It is shown that for one period of time the disk rotates in a reverse direction as shown at 38 and of course it will be appreciated that whenever the disk rotates in a reverse direction this reverse rotation subtracts from the number of turns counted on the conventional recording system 15.

The detection of the rotation of the disk is carried out by the provision of a dark segment 39 formed on the undersurface of the disk leaving the remainder of the disk as a reflective or white material. The detection system thus provides a pair of light emitting diodes 40 and 41 which are positioned on the housing so as to direct light onto the underside of the disk. The diodes 40 and 41 are angularly spaced around the disk. The diodes are associated with photo diodes 42 and 43 which receive light when the disk is positioned so that the light from the associated diode 40 or 41 falls upon the reflective part of the disk and that light is cut off when the dark part of the disk reaches the requisite location. Basically therefore one of the pairs of light emitting diodes and photo diodes is used to detect the passage of the dark segment that is of course one rotation of the disk. The direction of rotation is then detected by checking with the other of the pairs as the dark segment reaches the first of the pairs a to whether the second pair is also seeing the dark segment or whether it is seeing the reflective part. Provided the sensors are properly spaced in relation to the dimension of the segment therefore this will indicate the direction which the disk rotated to reach the position which is detected by the first pair of diodes.

In order to conserve energy, the sensors are primarily in a sampling mode using an adaptive sensing rate algorithm. In one example the dark or non-reflective segment is 108° of arc and there is provided a 50° displacement between the sensors. In a practical example of conventional meter, the maximum rotation rate is of the order of 2 rps. A basic sample interval can be selected at 125 m/sec, short enough to ensure at least one dark sample will be obtained from the dark segment. In operation, only the first pair of sensors is sampled continuously. When a dark response is observed, second confirming sample will be obtained and the sample rate will be increased to 16 pps. As soon a light segment of the disk is sensed, the second sensor is sampled. The second sensor still sees the dark segment then cw rotation is confirmed while if a light segment is observed then ccw rotation is indicated.

At slower speeds, the algorithm will result in a sample rate of 8 pps for 70% of a rotation and 16 pps for 30% of a rotation for the first pair of sensors plus two samples for direction sensing for the second pair. For an annual average consumption of 12,000 kwh, the disk rotates approximately 1.6 million times.

In order to sense this presence of stray light which could interfere with measurements, the photo diode output will be sampled immediately before and immediately after the LED is activated. If light is sensed with the LED off, stray light is indicated an alarm may be initiated after confirming test. The latter may include a test of other sensors such as the optical communication port sensor discussed hereinafter.

Communication from the unit to a separate reader indicated at 50 is provided by optical transmission. The transmission device is provided by a light emitting diode 51 controlled by a transmission line 52. Receiving of the signals from the reader is provided by a photo diode 53.

The microprocessor is controlled to provide a read out along the line 52 whenever a predetermined signal is received on the line 53. Thus each unit can have a separate code which is required to be received at the receiving line before the contents of the memory can be read. On receiving the signal, the microprocessor acts to read out the information through the optical transmission system to the portable reader 50. As shown in FIG. 2, the diode 52 and the photo diode 53 are located on one side of the housing so they can transmit to a reader located outside the transparent housing at one side of the unit.

The reader acts merely to record the information transmitted and to hold that information in memory for release to a remote analysis element generally maintained at a central office.

The reader can be operated while the meter remains on site or the meter can be removed and returned to a central servicing unit before being read.

In one example the memory 21 can be arranged to store 110 days of material following which it acts to place the 111th day of material back on the first available location thus cancelling the material stored from the first day. However the 110 days of recorded information is in most cases sufficient to carry out a proper analysis of the consumption pattern including the tamper events. This analysis can then generate a predicted actual consumption relative to a metered consumption so that if any differences arise the analysis can be provided to the customer stealing the service to provide an indication of the actual amount required to be paid as opposed to the metered amount.

The details of the analysis algorithm will not be provided here as they will be within the skill of one knowledgeable in this art.

In order to prevent exhaustion of the internal battery by excessive reading, read-outs are limited by the microprocessors to an average of two per hour based upon the internal clock time. Thus if there has been no read-out for the last six hours, one could get twelve read-outs within a single hour.

The device therefore enables detection of conventionally known tampering activities and not only indicates the presence of a tampering event but in addition provides records which will enable by analysis a calculation to be made of actual consumption as opposed to the metered consumption for the purposes of collecting the necessary funds from the stealing user.

While the above description relates to a device for use with an electricity meter, it will be appreciated that the same techniques can be applied to gas or water meters in which there is provided a moving element which is operated by the consumption of the utility concerned. In such a case, the movement of the element for example a shaft can be detected by a magnetic reed switch.

While the above device uses direct reading by optical transmission, in some cases short range radio transmission may be desirable to allow the device to be read without the necessity for close approach which could warn a tamperer. In other cases transmission may be over long distance radio transmission as part of a remote meter reading system.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

We claim:

1. A method or detection of unauthorized tampering with the operation of a utility meter and for estimation of the difference between measured utility consumption and an actual utility consumption comprising mounting a unit in a utility meter of a type having a moving element, the unit being separate from the meter and removable therefrom, generating a plurality of sequential time periods of predetermined length, detecting during each respective time period a summation of the movement of the moving element and recording, in association with the respective time period, said summation in a memory as information stored in the memory, in each of said time periods, detecting one or more events associated with possible tampering attempts and recording, in association with the respective timer period, the existence of such event in the memory as information stored in the memory, reading from the unit the information stored in the memory, analyzing the information stored in relation to the time and day of the respective time period recorded and in relation to any tampering event recorded in the respective time period to thus obtain a pattern during said sequential time periods of actual consumption, and estimating from said pattern the actual consumption during those time periods a tampering event has been recorded.

2. The method according to claim 1 wherein said analyzing includes the step of obtaining information concerning the temperature in said respective time periods.

3. The method according to claim 1 wherein said moving element comprises a rotatable disk and wherein rotation of the disk in a forward direction and rotation of the disk in a rearward direction are detected.

4. The method according to claim 3 wherein forward and rearward movements are detected by detecting reflected light from the disk at a first position, said second position being angularly spaced from the first position, and providing a portion of the disk which is of different reflective characteristic relative to a remaining part of the disk.

5. The method according to claim 1 wherein said detecting of tampering attempts includes detecting tilt of said unit.

6. The method according to claim 1 wherein said detecting of tampering attempts includes detecting reverse movement of said moving element.

7. The method according to claim 1 wherein the utility meter comprises a meter for measuring electricity usage and wherein said detecting of tampering attempts includes detecting absence of an electric field.

8. The method according to claim 1 wherein the utility meter comprises a meter for detecting electricity usage and wherein said detecting of tampering attempts includes detecting a magnetic field.

9. The method according to claim 1 wherein the utility meter includes a cover and wherein said detecting of tampering attempts includes projecting radiation onto a reflective element on the cover and detecting the presence of said radiation reflected from said reflective element.

10. The method according to claim 1 wherein said detecting of tampering attempts includes detecting acoustic waves transmitted by a cutting action on the utility meter.

11. The method according to claim 1 wherein said detecting of tampering attempts includes detecting an approximate measure of consumption of said utility meter during a respective time period separate from said moving element and comparing the approximate measure with the summation of movements of said moving element.

12. The method according to claim 1 wherein said information stored is read from the unit by an optical transmission/reading means transmitting through a transparent portion of a cover of the meter.

13. The method according to claim 1 wherein the information stored relates to a plurality of said sequential time periods and wherein said information stored relating to said plurality of sequential time periods is read from the unit at a single occasion of reading.

14. A tamper detection apparatus for a utility meter of the type having a moving element driven by usage of the utility, the apparatus comprising a housing shaped and arranged so as to be separate from the meter and mountable inside the meter, first transducer means for detecting movement of said moving element, second transducer means for detecting one or more events associated with possible tampering attempts, memory means for recording a summation of the amount of movement detected by the first transducer means and the detection of a tampering event by said second transducer means, a battery for providing power to said transducer means and said memory means, and means for transmitting to a reader information stored in the memory, said second transducer means comprising an acoustic detection means arranged to detect a cutting or drilling action on the meter.

* * * * *